United States Patent
Lui et al.

(10) Patent No.: US 10,418,899 B2
(45) Date of Patent: Sep. 17, 2019

(54) MOSFET SWITCH CIRCUIT FOR SLOW SWITCHING APPLICATION

(71) Applicant: Alpha and Omega Semiconductor Incorporated, Sunnyvale, CA (US)

(72) Inventors: Sik K. Lui, Sunnyvale, CA (US); Daniel S. Ng, Campbell, CA (US); Xiaobin Wang, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 342 days.

(21) Appl. No.: 14/252,568

(22) Filed: Apr. 14, 2014

(65) Prior Publication Data
US 2015/0295495 A1 Oct. 15, 2015

(51) Int. Cl.
*H02M 3/158* (2006.01)
*H03K 17/16* (2006.01)

(52) U.S. Cl.
CPC .......... *H02M 3/158* (2013.01); *H03K 17/164* (2013.01)

(58) Field of Classification Search
CPC ............................. H02M 3/158; H03K 17/164
See application file for complete search history.

(56) References Cited

U.S. PATENT DOCUMENTS

| | | | | |
|---|---|---|---|---|
| 5,637,902 A * | 6/1997 | Jiang | .................. | H01L 27/0251 257/336 |
| 6,268,286 B1 * | 7/2001 | Gauthier, Jr. | ..... | H01L 21/28518 257/E21.006 |
| 6,559,507 B1 * | 5/2003 | Vashchenko | ........ | H01L 29/7835 257/356 |
| 6,747,505 B1 * | 6/2004 | Gergintschew | ...... | H03K 17/164 327/404 |
| 2001/0031524 A1 * | 10/2001 | Kim | ...................... | H01L 27/105 438/201 |
| 2009/0218890 A1 * | 9/2009 | Lui | ..................... | H01L 29/0696 307/113 |
| 2012/0268091 A1 * | 10/2012 | Takemae | .............. | H03K 17/164 323/272 |
| 2013/0240991 A1 * | 9/2013 | Tsuchiya | ......... | H01L 21/823878 257/347 |
| 2015/0001927 A1 | 1/2015 | Han et al. | | |

FOREIGN PATENT DOCUMENTS

TW 201304139 1/2013

* cited by examiner

*Primary Examiner* — Lincoln D Donovan
*Assistant Examiner* — Colleen J O Toole
(74) *Attorney, Agent, or Firm* — Patent Law Works LLP

(57) ABSTRACT

A switch circuit includes a first MOS transistor and a second MOS transistor of a same conductivity type connected in parallel between a first terminal and a second terminal. The first and second MOS transistors have respective gate terminals coupled to the control terminal to receive a control signal to turn the switch circuit on or off where the control signal transitions from a first voltage level to a second voltage level at a slow rate of change. The first MOS transistor has a first threshold voltage and the second MOS transistor has a second threshold voltage where the first threshold voltage is less than the second threshold voltage.

18 Claims, 11 Drawing Sheets

(a)

(b)

MOSFET SWITCH CIRCUIT FOR SLOW SWITCHING APPLICATION

BACKGROUND OF THE INVENTION

Portable electronic devices are incorporating load switches to implement power management functions. In particular, there is a need in portable electronic devices to extend battery life while maintaining performance level. Load switches are used in portable electronic devices to enable the system to make power management decisions based on the peripherals or sub-circuits currently being used. When incorporated in an electronic device, a load switch is controlled by the electronic device to connect or disconnect a voltage rail to a specific load. The load switch provides a means to power a load when it is in demand so as to allow the electronic device to maximize performance.

A load switch circuit is typically implemented using a switching device controlled by an on-off control signal. The switching device is typically a MOSFET (metal-oxide-semiconductor field-effect-transistor) device that passes the supply voltage to a specific load when the transistor is turned on by the control signal. Load switch circuit can be configured for high-side switching or low-side switching. FIG. 1, which includes FIGS. 1(a) to 1(c), illustrates examples of conventional load switch circuits. More specifically FIG. 1(a) illustrates a load switch circuit configured for high-side switching. The load switch circuit includes a load switch LS1 to connect a load 10 to a supply voltage 12, which is a battery voltage $V_{BAT}$ in the present example. For high-side switching, load switch LS1 is typically implemented as a PMOS transistor.

FIG. 1(b) illustrates a load switch circuit configured for low-side switching. The load switch circuit includes a load switch LS2 to connect a load 10 to a supply voltage 12, which is a battery voltage $V_{BAT}$ in the present example. For low-side switching, load switch LS2 is typically implemented as an NMOS transistor, as shown in FIG. 1(c). Referring to FIG. 1(c), a low-side load switch is implemented using an NMOS transistor M10 configured to couple the supply voltage 12 to the load 10, represented as a resistor $R_{Load}$. The transistor M10 is controlled by a control voltage Vin (node 14) which is typically a slow ramp voltage signal. A slow ramp control voltage is used to turn on the load switch slowly so that the load 10 does not experience a current surge.

However, as the gate voltage of the load switch transistor M10 ramps up, the transistor may be biased in the saturation region or linear mode for a long time. When biased in the saturation region, the transistor M10 operates at high drain current and high drain-to-source voltage. When the transistor M10 dwells in the saturation region and operating at high current and high voltage for a long time, the load switch transistor can heat up. Excessive heating at the load switch may result in thermal runaway during the control voltage ramp up time, resulting in permanent device failure.

BRIEF DESCRIPTION OF THE DRAWINGS

Various embodiments of the invention are disclosed in the following detailed description and the accompanying drawings.

FIGS. 1(a) to 1(c), illustrates examples of conventional load switch circuits.

FIG. 3(a) and FIG. 3(b), illustrates switch circuits in embodiments of the present invention.

FIG. 7, which includes

FIG. 8, which includes

DETAILED DESCRIPTION

Figure 1:
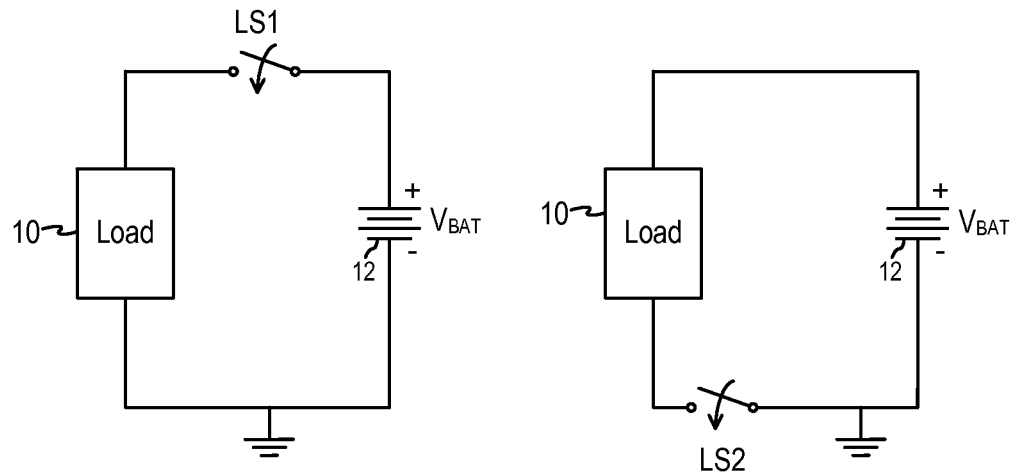
FIG. 1, which includes
Figure 1:
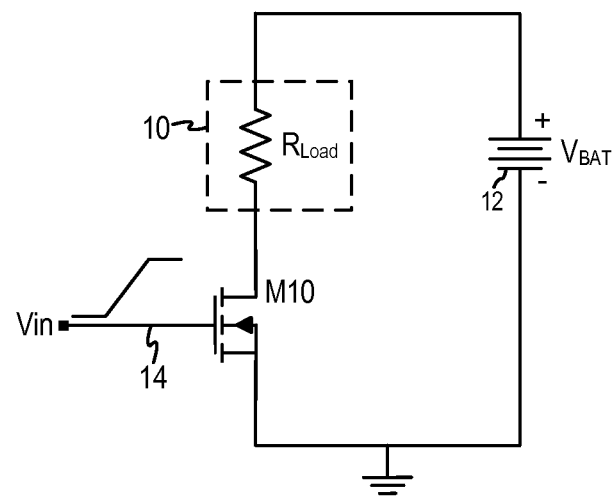

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a switch circuit includes a pair of parallel connected MOSFET devices with different threshold voltage characteristics and different transistor sizing. The switch circuit is typically controlled by a slow ramp control voltage signal to turn on the switch circuit. As the control voltage ramps up, a first MOSFET device with low threshold voltage and small area is turned on first to conduct current and then a second MOSFET device with higher threshold voltage and larger area is turned on. In this manner, the second MOSFET device with larger area is not turned on until after the drain-to-source voltage has been pull down by the first MOSFET device. Switch circuit failures due to thermal runaway are thereby avoided. In some embodiments, the parallel-connected transistors of the switch circuit are formed on a monolithic semiconductor chip and the first MOSFET device is formed evenly distributed on the semiconductor chip for optimal power dissipation.

In embodiments of the present invention, the switch circuit is used as a load switch to switch a load, such as to connect the load to a supply voltage. When the switch circuit is used to switch a load, the switch circuit of the present invention is sometimes referred to as a "load switch" or "load switch circuit." It is understood that the switch circuit of the present invention can have many applications and using the switch circuit as a load switch is one example application. In general, the switch circuit of the present invention has a first terminal coupled to a first circuit node, a second terminal coupled to a second circuit node, and a control terminal coupled to receive a control signal for turning on or off the switch circuit. In some embodiments, the first circuit node is coupled to a load and the second circuit node is coupled to a power supply voltage.

Figure 2:
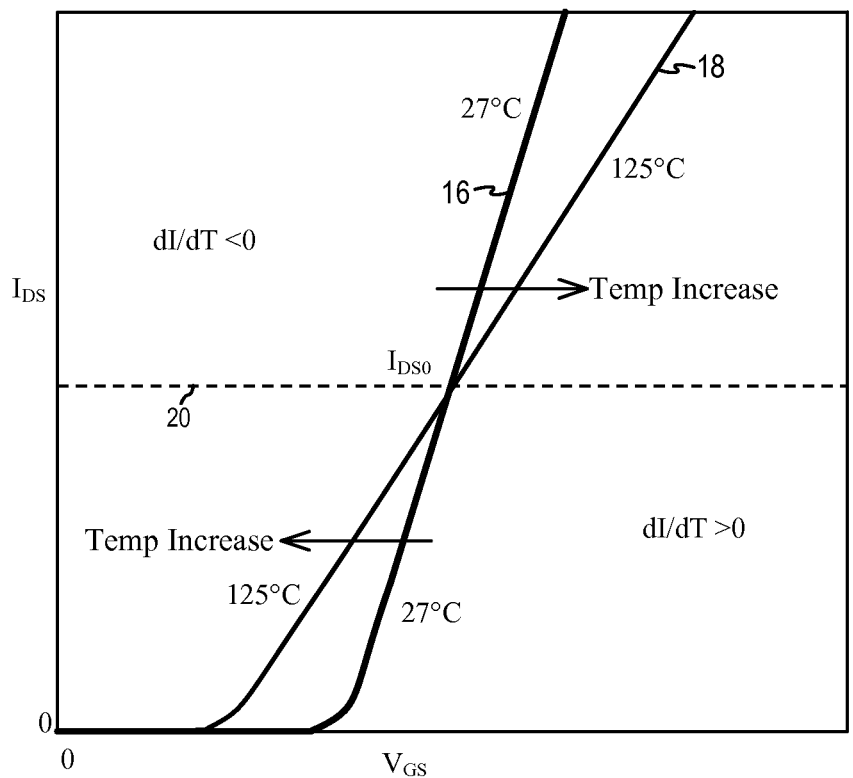
FIG. 2 is a graph illustrating the transfer characteristics of the drain current versus gate-to-source voltage of a MOSFET device.

FIG. 2 is a graph illustrating the transfer characteristics of the drain current versus gate-to-source voltage of a MOSFET device. Referring to FIG. 2, for a given drain-to-source voltage (or drain voltage) $V_{DS}$, when the gate-to-source voltage (or gate voltage) $V_{GS}$ of the MOSFET device is greater than a given threshold voltage, the transistor starts conducting drain current $I_{DS}$. In particular, the drain current $I_{DS}$ increases quickly relative to the gate voltage. However, the drain current $I_{DS}$ exhibits certain temperature dependent characteristics. Curves 16 and 18 illustrate the drain current of the MOSFET device over a temperature range of 27° C. to 125° C. In particular, as the temperature increases, the threshold voltage at which the drain current starts conducting decreases while the slope of drain current (the transconductance) also decreases. As a result, the drain current versus gate voltage of MOSFET device over a temperature range have a drain current crossover point at a drain current level $I_{DS0}$ denoted by the dotted line 20.

If the MOSFET device is operated in the region under the drain current crossover point, that is, the drain current is under $I_{DS0}$, as the device heats up and the operating temperature increases, the drain current behavior shifts from curve 16 towards curve 18 and the drain current increases. That is, the change in drain current versus temperature is greater than zero (dI/dT>0). As the operating temperature and drain current continue to increase, thermal runaway can occur leading to device failure. However, if the MOSFET device is operated in the region above the drain current crossover point, that is, the drain current is greater than $I_{DS0}$, as the device heats up and the operating temperature increases, the drain current behavior shifts from curve 16 towards curve 18 and the drain current actually decreases. That is, the change in drain current versus temperature is less than zero (dI/dT<0). In this region of operation, the MOSFET device avoids thermal runaway and becomes thermally stable.

For a MOSFET device used as a load switch, it is therefore desirable to operate the MOSFET device with a drain current greater than $I_{DS0}$ so that thermal stability is ensured when the MOSFET device is being turned on slowly by the slow ramp control voltage signal. However, when operated at a drain current level above $I_{DS0}$, the transistor will be run at a high current density where a large amount of current is being push through the transistor. In order to achieve high current density, a small area transistor needs to be used, leading to high on-resistance (RDSon) at the transistor which is undesirable.

If the MOSFET is to be operated at the thermally stable region above drain current $I_{DS0}$, it would then be desirable to use a MOSFET device with a low transconductance ($g_m$) because a lower transconductance of the transistor will push the drain current crossover point, or current $I_{DS0}$, lower, thus making it easier to operate with drain current above $I_{DS0}$. However, a low transconductance also results in a high on-resistance (RDSon) at the transistor which is also undesirable.

Figure 3:
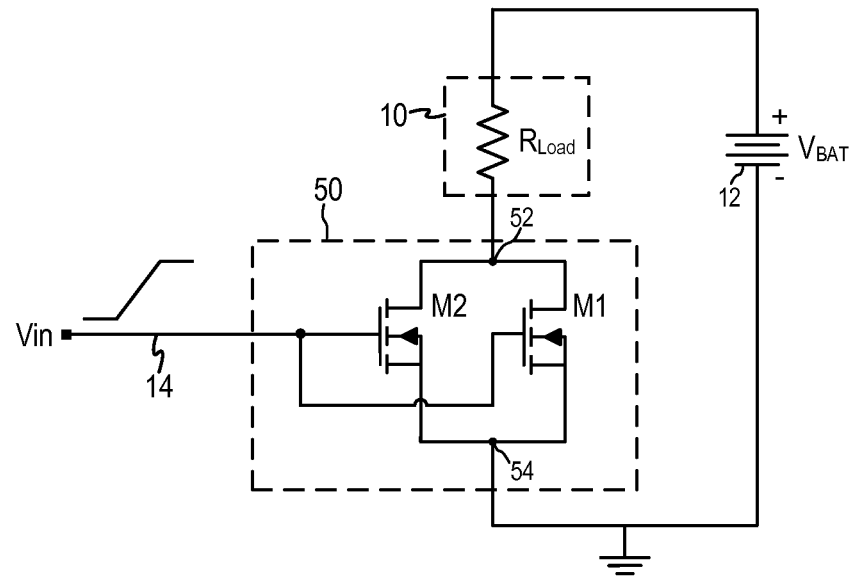
FIG. 3, which includes
Figure 3:
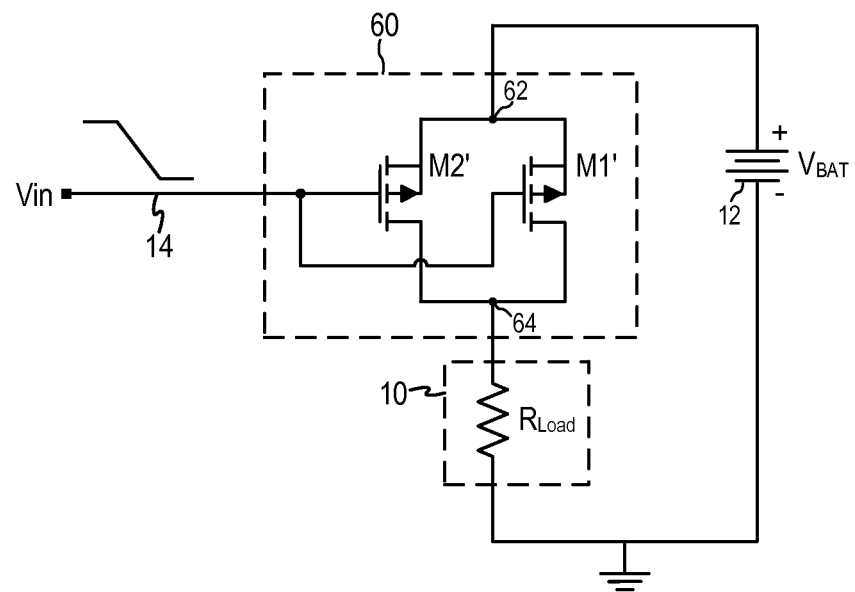

FIG. 3, which includes FIG. 3(a) and FIG. 3(b), illustrates switch circuits in embodiments of the present invention. FIG. 3(a) illustrates the switch circuit used as a load switch in a low-side switching configuration using N-type MOSFET devices (or NMOS transistors) and FIG. 3(b) illustrates the switch circuit used as a load switch in a high-side switching configuration using P-type MOSFET devices (or PMOS transistors). The construction of the switch circuit of the present invention for high-side or low-side switching is the same except for the polarity of the transistors used.

Referring first to FIG. 3(a), a load switch circuit 50 is coupled to switch a supply voltage 12 to a load 10. In the present example, the supply voltage 12 is a battery voltage $V_{BAT}$ and the load 10 is modeled as a resistor $R_{Load}$. The load switch circuit 50 includes a first terminal 52 coupled to a first circuit node, a second terminal 54 coupled to a second circuit node, and a control terminal (node 14) coupled to receive a slow ramp control voltage signal Vin. In the present embodiment, the load switch circuit 50 includes a first N-type MOSFET device (NMOS transistor M1) and a second N-type MOSFET device (NMOS transistor M2) connected in parallel between the first terminal 52 and the second terminal 54. In the present example, the first terminal 52 is coupled to a load 10 and the second terminal 54 is coupled to the negative terminal of the supply voltage 12. That is, the drain terminals of the NMOS transistors M1 and M2 are connected together at first terminal 52 and coupled to the load 10 while the source terminal of the NMOS transistors M1 and M2 are connected together at second terminal 54 and coupled to the negative terminal of the supply voltage 12 which is also the ground potential. NMOS transistors M1 and M2 have gate terminals that are driven by a slow ramp control voltage Vin (node 14) which turns on the NMOS transistors slowly using a slowly increasing voltage signal. That is, the control voltage Vin is a rising voltage signal, rising form a first voltage level to a second, higher voltage level. NMOS transistors M1 and M2 are configured with different threshold voltage characteristics and different transistor sizing.

More specifically, the first NMOS transistor M1 is constructed to have a lower threshold voltage ($V_{TH}$) than the second MOS transistor M2. Accordingly, with the same gate voltage $V_{GS}$ being applied, transistor M1 will turn on and starts conducting current before transistor M2. Furthermore, the first NMOS transistor M1 is constructed to have a smaller transistor area than the second MOS transistor M2. In some embodiments, the transistor area for transistor M1 is a fraction of the transistor area of transistor M2. Thus, the first NMOS transistor M1 will also have a lower transconductance (lower $g_m$) than the second MOS transistor M2. With the lower transconductance, transistor M1 will have a larger on-resistance RDSon than transistor M2. In other words, transistor M2 has a lower on-resistance RDSon than transistor M1. However, with the lower transconductance, transistor M1 will have a lower drain current crossover point $I_{DS0}$ than transistor M2. Thus, it is easier to bias transistor M1 to the thermally stable operation region above current $I_{DS0}$.

The transistor characteristics for the two parallel connected NMOS transistors M1 and M2 in the load switch circuit 50 are summarized in the table below:

|  | Transistor M1 | Transistor M2 |  |
| --- | --- | --- | --- |
| Threshold Voltage | Lower $V_{TH}$ | High $V_{TH}$ | $V_{TH2} > V_{TH1}$ |
| Transistor Area (W) | Smaller Area | Larger Area | Area(M2) > Area(M2) |
| Transconductance | Smaller $g_m$ | Larger $g_m$ | $g_{m2} > g_{m1}$ |
| On-Resistance | Larger RDSon | Smaller RDSon | RDSon1 > RDSon2 |
| Drain Current Crossover Point | Lower $I_{DS0}$ | Higher $I_{DS0}$ | $I_{DS02} > I_{DS01}$ |

FIG. 3(b) illustrates a load switch circuit 60 is coupled to switch a supply voltage 12 (battery voltage $V_{BAT}$) to a load 10 (resistor $R_{Load}$). The load switch circuit 60 includes a first terminal 62 coupled to a first circuit node, a second terminal 64 coupled to a second circuit node, and a control terminal (node 14) coupled to receive a slow ramp control voltage signal Vin. In the present embodiment, load switch circuit 60 is configured for high-side switching and includes a first P-type MOSFET device (PMOS transistor M1') and a second P-type MOSFET device (PMOS transistor M2') connected in parallel between the first terminal 62 and the second terminal 64. In the present example, the first terminal 62 is coupled to the positive terminal of the supply voltage 12 and the second terminal 64 is coupled to the load 10. That is, the source terminals of the PMOS transistors M1' and M2' are connected together at first terminal 62 and coupled to the positive terminal of the supply voltage 12 and the drain terminal of the PMOS transistors M1' and M2' are connected together at second terminal 64 and coupled to the load 10. PMOS transistors M1' and M2' have gate terminal that are driven by a slow ramp control voltage Vin (node 14') which turns on the PMOS transistors slowly using a slowly decreasing voltage signal. That is, the control voltage Vin is a falling voltage signal, decreasing form a first voltage level to a second, lower voltage level. PMOS transistors M1' and M2' are configured with different threshold voltage characteristics and different transistor sizing, in the same manner as described above with reference to transistors M1 and M2 in load switch circuit 50. In particular, PMOS transistor M1' has a lower threshold voltage and a smaller area than PMOS transistor M2'. The characteristics of transistors M1' and M2' are similar to that of transistors M1 and M2 as described above and illustrated in the above table.

It is understood that the threshold voltage for PMOS transistors are negative voltage values. In the present description, a PMOS transistor M1 with a lower threshold voltage than PMOS transistor M2 refers to PMOS transistor M1 with a threshold voltage closer to zero as compared to the PMOS transistor M2. That is, the absolute value of the threshold voltage of the PMOS transistor M1 is smaller than the absolute value of the threshold voltage of PMOS transistor M2.

In the following description, the operation and fabrication of load switch circuit will be described primarily with reference to the NMOS transistor load switch circuit of FIG. 3(a). It is understood that the operation and construction of a PMOS transistor load switch circuit of FIG. 3(b) is similar to the NMOS load switch circuit with appropriate changes in voltage and dopant polarities. For example, in the operation of the load switch circuit, the slow ramp control voltage signal Vin is applied to turn on the load switch circuit. In case of the NMOS transistor load switch, the control voltage signal is a slowly rising voltage signal. In case of the PMOS transistor load switch, the control voltage signal is a slowly falling voltage signal. In the present description, a slow ramp control voltage signal refers to a voltage signal that transitions from an inactive voltage level to an active voltage level at a slow rate of change, between 50V per second to 1000V per second. An inactive voltage level refers to a voltage level for turning off the MOS transistor and an active voltage level refers to a voltage level for fully turning on the MOS transistor. Furthermore, in the following description, it is understood that transistor M1 or M1' refers to the transistor in the parallel connected transistor pair of the load switch circuit having the smaller transistor area and lower threshold voltage than the other transistor in the pair which is referred to as transistor M2 or M2'.

The operation of the load switch circuit of the present invention will now be described with reference to the load switch circuit 50 of FIG. 3(a). The slow ramp control voltage signal Vin is activated to turn on the load switch circuit 50. The control voltage signal Vin is a slow ramp signal to turn on load switch circuit 50 slowly. In some examples, the control voltage signal Vin may have a ramping rate of 10V per second; the threshold voltage $V_{TH1}$ of the transistor M1 may be 1V while the threshold voltage $V_{TH2}$ of the transistor M2 may be 2.5V; and transistor M1 may have an area that is about 20% of the area of transistor M2. In other embodiments, transistor M1 may have an area of about 5% to 45% of the area of transistor M2

When the slow ramp control voltage signal Vin reaches the threshold voltage $V_{TH1}$ of the transistor M1, the transistor M1 turns on first to conduct current. At this time, all the current through the load 10 is conducted through transistor M1. Because transistor M1 has a smaller area and a lower $I_{DS0}$ value, when only transistor M1 is turned on, the large current density flowing through the transistor biases the transistor M1 to operate in the region above the drain current crossover point ($I_{DS01}$). Thus, as the control voltage signal Vin ramps up, transistor M1 is operated in the thermally stable region above the drain current crossover point ($I_{DS01}$) and thermal runaway is avoided.

With transistor M1 is turned on and conducting current, transistor M1 pulls down on the voltage at the drain terminal (node 52) so that the drain-to-source voltage $V_{DS}$ across transistors M1 and M2 decreases. Then, as the control voltage signal Vin ramps up to the threshold voltage $V_{TH2}$ of the transistor M2, transistor M2 turns on and shares the load current with transistor M1. More specifically, both transistors M1 and M2 are now turned on to share the current flowing through the load 10. However, transistor M2 does not experience a high drain voltage $V_{DS}$ as the drain voltage at node 52 is already pull down by transistor M1. Therefore, as transistor M2 is being turned on by the slow ramp signal Vin, transistor M2 does not operate in a high drain voltage regime and thermal runaway at transistor M2 is avoided.

The load switch circuit 50 may be turned off by ramping down the control voltage signal Vin. The transistor M2 is turned off when the voltage Vin is below the threshold voltage $V_{TH2}$ and transistor M1 remains conducting in the thermally stable region above $I_{DS01}$. When the control voltage signal Vin drops below the threshold voltage $V_{TH1}$, transistor M1 is also turned off.

During the operation of the load switch circuit, the power dissipation at the load switch circuit is high only during the control voltage ramping period. To ensure safe circuit operation, it is only necessary for the MOSFET devices of the load switch circuit to survive the control voltage ramp up as the power dissipation of the load switch circuit drops after the load switch circuit is turned on. In the load switch circuit of the present invention, transistor M1 is turned on during the initial control voltage ramping period and is biased to operate in the thermally stable region above the drain current crossover point. Then, transistor M2 is turned on and the power dissipation drops significantly and the load switch circuit is no longer susceptible to thermal runaway.

In the switch circuit of the present invention, transistor M1 dissipates all of the power during the ramping up period before transistor M2 turns on. In some embodiments of the present invention, the switch circuit of the present invention is constructed using discrete transistors for the transistors M1 and M2 (or the transistors M1' and M2'). In other embodiments, the switch circuit of the present invention is constructed on a monolithic semiconductor chip and the transistors M1 and M2 are formed on the same semiconductor substrate. In some embodiments, the low-threshold-small-area transistor M1 is evenly distributed over the semiconductor chip to optimize the power dissipation of the switch circuit. More specifically, the transistor M1 is formed as multiple transistor cell distributed evenly over a large area of the semiconductor chip instead of being formed localized in one area of the semiconductor chip. By distributing transistor M1 over a large area of the semiconductor chip, the power dissipation is spread out over the large area and the effective thermal resistance is lowered and localized heating of the semiconductor chip is obviated. In some embodiments, transistor M1 has an area that is about 5% to 45% of the area of transistor M2 and transistor M1 is formed as transistor cells that are distributed over the transistor area of transistor M2.

In other embodiments, the power dissipation of the load switch circuit can be optimized by varying the threshold voltages of transistors M1 and M2. Alternately, the power dissipation of the load switch circuit can be optimized by varying the area ratio of transistors M1 and M2. In alternate embodiments of the present invention, the low-threshold-small-area transistor M1 can be constructed using various semiconductor fabrication structures and techniques to optimize the transistor operation in the saturation region. In some embodiments, transistor M1 can be constructed using a longer channel, a thicker gate oxide, or using source ballasting, as will be described in more detail below.

The load switch circuit of the present invention realizes many advantages over conventional load switch circuit. First, the load switch circuit of the present invention ensures thermal stability by using a pair of parallel connected MOSFET device with one MOSFET device being operated in the thermally stable region above the drain current crossover point during the control signal ramping up period. The second, larger MOSFET device is turned on only after the drain voltage is pulled down so that thermal runaway is avoided. Second, the load switch circuit uses a small MOSFET with high on-resistance during the initial ramping period and then uses a larger MOSFET with low on-resistance in parallel for normal load switch operation. Thus, the load switch circuit has only a small area penalty due to transistor M1 but the load switch circuit can operate at a low on-resistance as desired. Lastly, the load switch circuit of the present invention allows for ease of implementation where the threshold voltages and the area ratios of transistors M1 and M2 can be selected to optimize the load switch circuit operation and the power dissipation for different applications.

Figure 4:
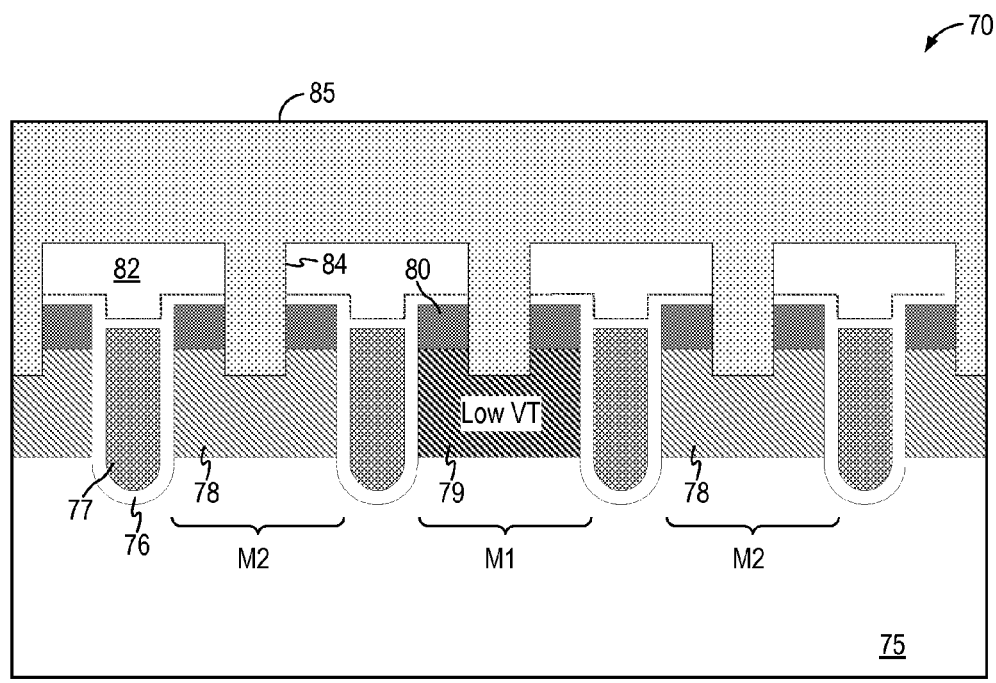
FIG. 4 is a cross-sectional view of a parallel-connected transistor pair which can be used to form the load switch circuit in embodiments of the present invention.

The parallel-connected transistor pair (transistors M1 and M2) in the load switch circuit of the present invention can be constructed in various ways to achieve the desired threshold voltage differential and transistor area ratio. In embodiments of the present invention, the parallel-connected transistor pair in the load switch circuit is constructed as trench transistors. In the present description, a trench transistor refer to a MOS transistor with the gate formed in a trench in a semiconductor layer and a vertical channel formed along the sidewall of the trench in a body region between the source region formed on the front side of a semiconductor layer and the drain region, typically formed in the semiconductor layer or at the backside of the semiconductor layer. Furthermore, in embodiments of the present invention, the parallel-connected transistor pair in the load switch circuit is constructed using an array of trench transistor cells. FIG. 4 is a cross-sectional view of a parallel-connected transistor pair which can be used to form the load switch circuit in embodiments of the present invention. Referring to FIG. 4, a parallel-connected transistor pair 70 includes transistors M1 and M2 that are formed as trench transistors in a semiconductor layer 75 of a first conductivity type. When the transistor pair is NMOS transistors, the semiconductor layer 75 is of N-type conductivity. When the transistor pair is PMOS transistors, the semiconductor layer 75 is of P-type conductivity. In the following description, the construction of the transistor pair will be described with reference to transistors M1 and M2 being NMOS transistors. It is understood that PMOS transistors can be formed in the same manner by reversing the conductivity types.

In some embodiments, the semiconductor layer 75 may include a semiconductor substrate and an epitaxial layer formed on the substrate. The exact structure of the semiconductor layer 75 is not critical to the practice of the present invention. In the trench transistor structure of FIG. 4, the semiconductor layer 75 functions as the drain region of the transistor pair. In one embodiment, the drain region can be electrically contacted through a backside drain terminal formed on the backside of the semiconductor layer 75. In other embodiments, a drain contact can be brought up to the front side of the semiconductor layer 75 at a location away from the trenches.

Trenches formed in the semiconductor layer 75 define an array of transistor cells forming transistors M1 and M2. In particular, the area ratio between transistor M1 and M2 is realized by assigning a first number of cells to transistor M1 and a second number of cells to transistor M2, the ratio of the first number of cells to the second number of cells forming the transistor area ratio between transistors M1 and M2. Furthermore, to improve the thermal resistance of M1, it is advantageous to evenly distribute the transistor cells for transistor M1 among the transistors cells for transistor M2. In the present illustration, a transistor cell for transistor M1 is shown as being formed in an area with four transistors cells for transistor M2.

Transistors M1 and M2 includes gate electrode that are formed in the trenches lined by a gate oxide layer 76 and filled with a polysilicon layer 77. Body regions 78, 79 are formed adjacent the trenches to form the channel area of the transistors. The body regions 78, 79 have an opposite conductivity type (e.g. P-type) as the semiconductor layer 75. Body regions 78, 79 are sometimes referred to as well regions. Source regions 80 are formed on the front-side of the semiconductor layer in each of the body regions. Source regions 80 have the same conductivity type (e.g. N-type) as the semiconductor layer 75. An insulating layer 82, typically a dielectric layer, is formed to insulate the trench and the source region thus formed. Contact openings 84 are made in the insulating layer 82 and through the top surface of the semiconductor layer to the body region 78. A conductive layer 85, such as a metal layer, is formed in the contact opening to electrically short the source and the body of the transistors and also to interconnect all the source regions of all of the transistor cells.

In the transistor cells thus formed, the doping concentration levels for the body regions 78 and 79 are selected so that the body region 79 has a lower threshold voltage than that of the body region 78. For example, the body region 79 is more lightly doped than the body region 78. Accordingly, transistor M1 is formed in the transistor cell with the lower threshold voltage (low-$V_{TH}$) body region 79 and transistor M2 is formed in the transistor cells with the body regions 78. Transistors M1 and M2 are connected in parallel by sharing the semiconductor layer 75 as the common drain region and by having all source regions interconnected by the conductive layer 85. Contacts to the gate electrodes formed in the trenches can be made in an appropriate area to electrically connect all the gate electrodes together and connect the gate electrodes to the control voltage signal.

As thus constructed, transistors M1 and M2 of the parallel-connected transistor pair 70 are formed with different threshold voltages by using different doping concentrations levels in the body regions. More specifically, transistor M1 is formed in low-$V_{TH}$ body regions. Furthermore, transistors M1 and M2 of the parallel-connected transistor pair 70 are formed with different area ratios by forming the low-$V_{TH}$ body region 79 in a portion of the transistors cells with the remaining transistor cells being formed with the high-threshold voltage body region 78.

Figure 5:
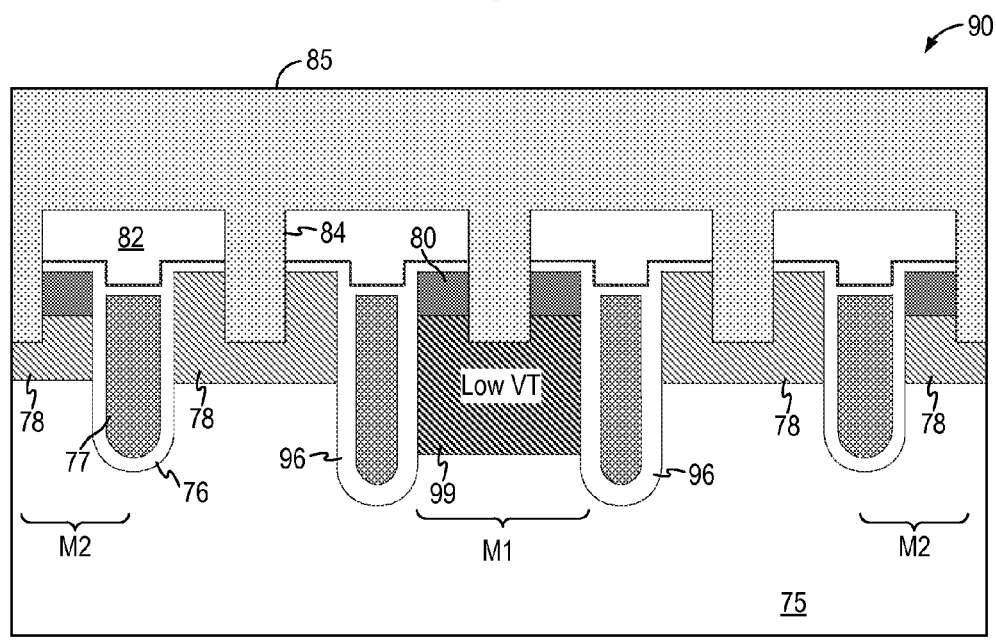
FIG. 5 is a cross-sectional view of a parallel-connected transistor pair which can be used to form the load switch circuit in alternate embodiments of the present invention.

In alternate embodiments of the present invention, the transistor M1 can be formed using features for optimized performance in the saturation region for extended time duration. FIG. 5 is a cross-sectional view of a parallel-connected transistor pair which can be used to form the load switch circuit in alternate embodiments of the present invention. Referring to FIG. 5, a parallel-connected transistor pair 90 includes transistors M1 and M2 that are formed as trench transistors in the same manner as described above with reference to FIG. 4. However, in the embodiment shown in FIG. 5, transistor M1 is formed in a transistor cell constructed with a low-$V_{TH}$ body region 99, longer channel and thicker gate oxide layer. In particular, the gate oxide layer 96 adjacent the transistor cell for transistor M1 has a thickness greater than the gate oxide layer 76 for the transistor cells for transistor M2. Furthermore, the low-$V_{TH}$ body region 99 for transistor M1 is deeper than the body region 78 for transistor M2, providing a longer channel between the source region 80 and the drain region 75. The trench depth of the transistor cell of transistor M1 has also been increased to accommodate the deeper body region. As this configured, transistor M1 has a thicker gate oxide layer and a longer channel to further reduce its transconductance. Note that in the present example, the source region 80 is omitted in the transistor cells adjacent the low-$V_{TH}$ body region 99 so that no transistor is formed in those transistor cells. Accordingly, on the semiconductor substrate, transistor M1 is formed with thick gate oxide and low-$V_{TH}$ body region 99 and transistor M2 is formed with thin gate oxide and high-threshold voltage body region 78.

Figure 6:
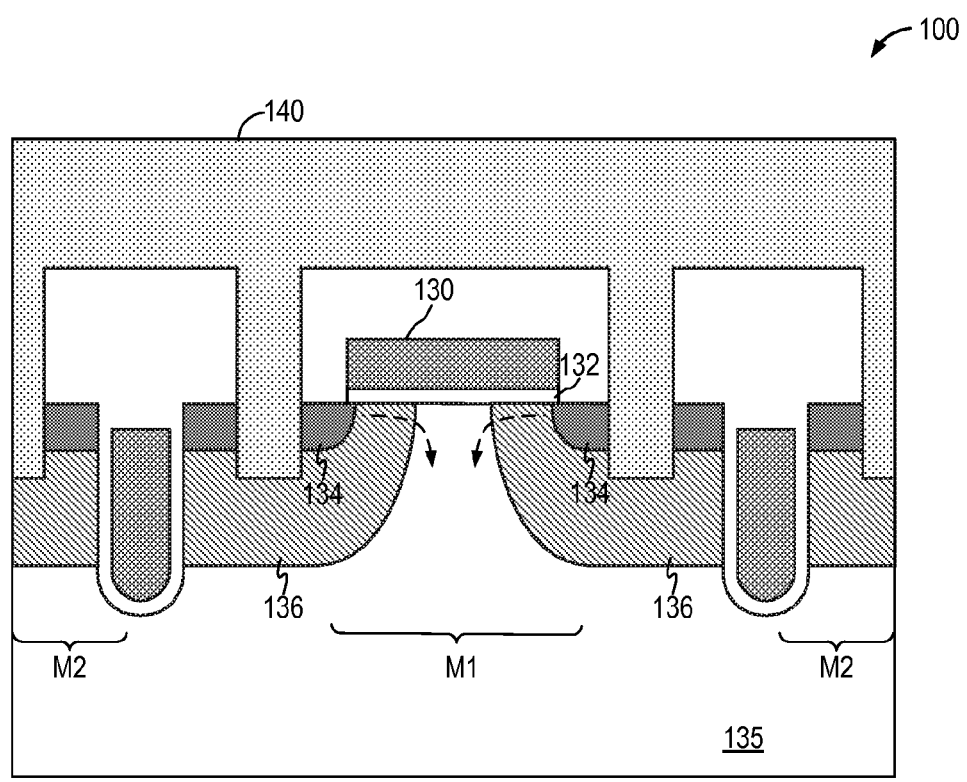
FIG. 6 is a cross-sectional view of a parallel-connected transistor pair which can be used to form the load switch circuit in alternate embodiments of the present invention.

In alternate embodiments of the present invention, the transistor M1 can be formed using a vertical transistor with a planar gate while transistor M2 is formed as a trench transistor. FIG. 6 is a cross-sectional view of a parallel-connected transistor pair which can be used to form the load switch circuit in alternate embodiments of the present invention. Referring to FIG. 6, a parallel-connected transistor pair 100 includes a transistor M1 formed using a planar gate and a transistor M2 formed as a trench transistor. The construction of the trench transistor for transistor M2 is same as that described above with reference to FIG. 4 and will not be further described. In the present embodiment, transistor M1 is formed using a planar gate 130 formed on the top surface of the semiconductor layer 135 and insulated from the semiconductor layer by a gate oxide layer 132. The planar gate 130 overlies body regions 136 forming the channel region of the transistor. Source regions 134 are formed on either side of the planar gate 130. In operation, the semiconductor layer 135 serves as the drain region of the transistor and the transistor has a lateral channel in the body regions 136 under the planar gate 130 and a vertical current path to the drain region 135. Contact openings are formed and a metal layer 140 is used to electrically connect the source regions of the planar gate transistor M1 and the source regions of the trench gate transistor M2. The threshold voltage and transistor size of the planar gate transistor M1 can be selected to optimize transistor M1 for operation in the saturation region.

Figure 7A:
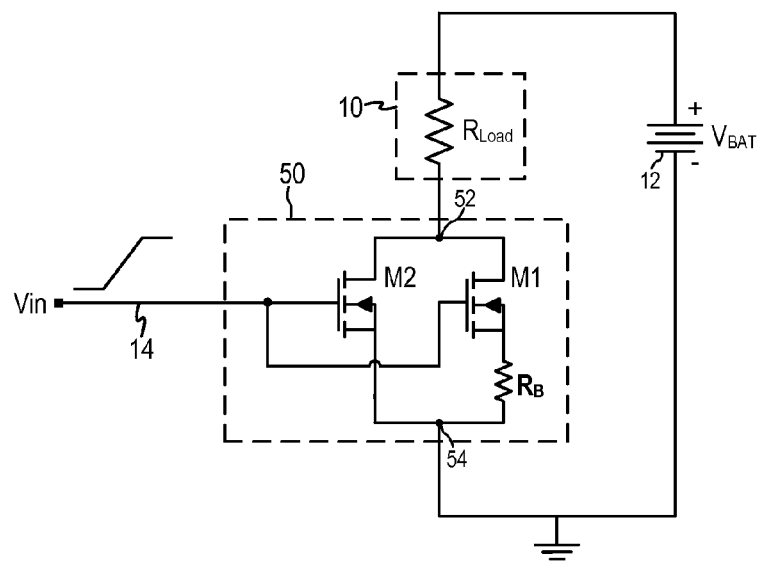
FIGS. 7(a) to 7(c), illustrates a parallel-connected transistor pair including a ballast resistor in alternate embodiments of the present invention.
Figure 7B:
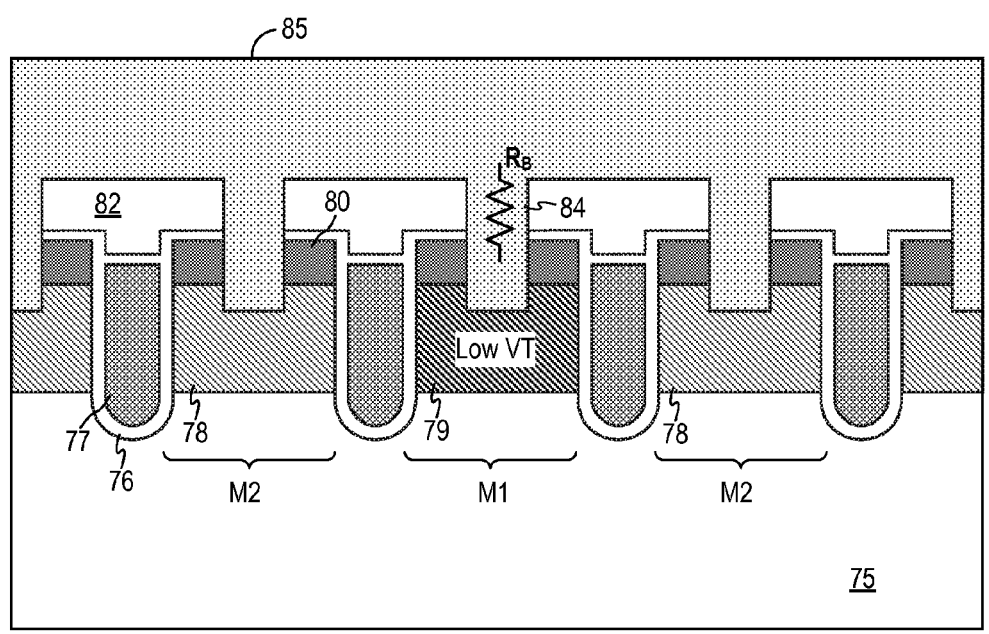
Figure 7C:
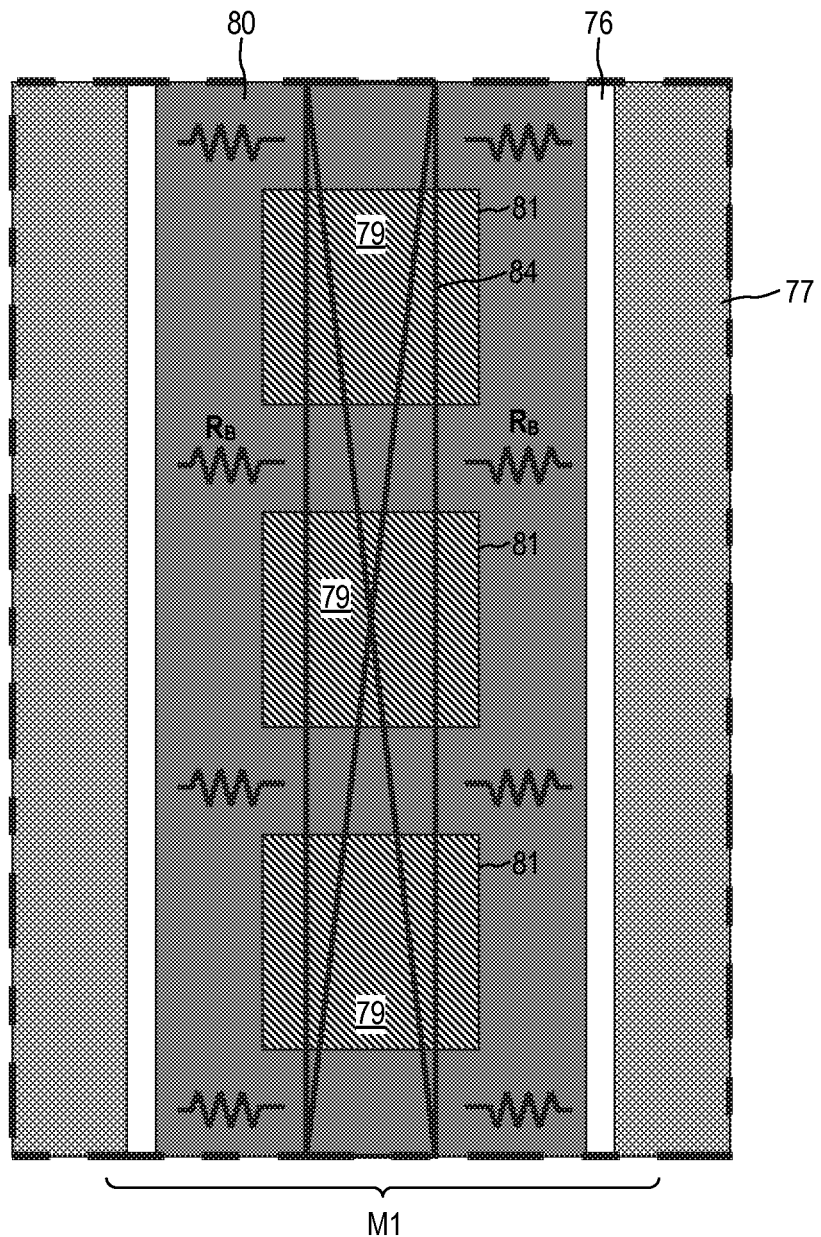

In alternate embodiments of the present invention, source ballasting can be added to transistor M1. FIG. 7, which includes FIGS. 7(a) to 7(c), illustrates a parallel-connected transistor pair including a ballast resistor in alternate embodiments of the present invention. Referring to FIG. 7(a), a ballast resistor $R_B$ can be added to the source terminal of transistor M1 to even out the current density among all the transistor cells. FIG. 7(b) duplicates FIG. 4 and illustrates the incorporation of the ballast resistor $R_B$ at the source terminal of the low-$V_{TH}$ transistor M1. In some embodiments, the ballast resistor $R_B$ can be added by layout changes of the source mask without affecting the fabrication process of transistors M1 and M2. An example of the layout changes is shown in FIG. 7(c). Referring to FIG. 7(c), a source ballast resistor $R_B$ is formed by removing the source region 80 in areas 81. Thus, in areas 81, the semiconductor layer has only the low-$V_{TH}$ body region 79 formed therein. A contact is formed in the contact opening 84 which overlies the source region 80 and the areas 81. As thus constructed, source current has to flow through the reduced source diffusion regions 80 to reach the contact formed in the contact opening 84. The reduced source diffusion regions 80 thereby increase the source resistance, forming the ballast resistor $R_B$.

Figure 8A:
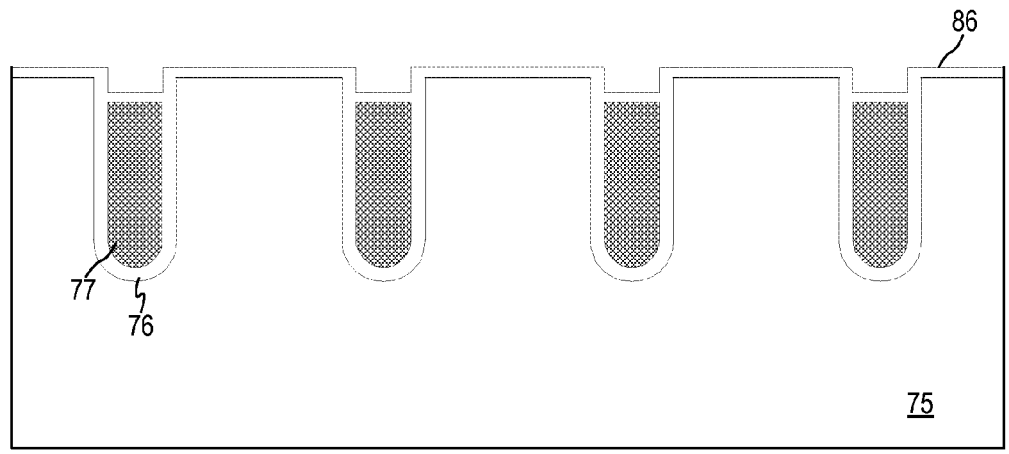
FIGS. 8(a) to 8(h), illustrates the fabrication process for forming the parallel-connected transistor pair of FIG. 4 in embodiments of the present invention.

FIG. 8, which includes FIGS. 8(a) to 8(h), illustrates the fabrication process for forming the parallel-connected transistor pair of FIG. 4 in embodiments of the present invention. Referring to FIG. 8(a), trenches are formed in semiconductor layer 75. The gate oxide layer 76 is grown in the trenches and the trenches are filled with a polysilicon gate layer 77. A dielectric layer 86 may be formed above the trenches to cap the trenches and above the semiconductor layer as an implant buffer layer.

Figure 8B:
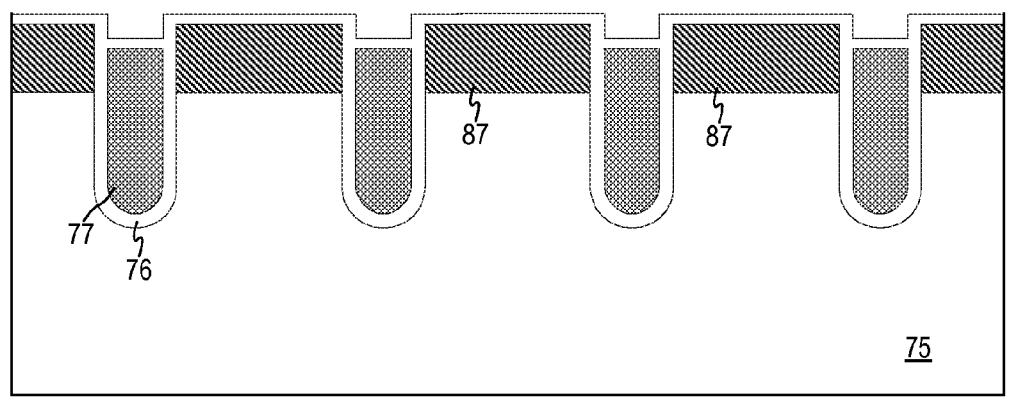
Figure 8C:
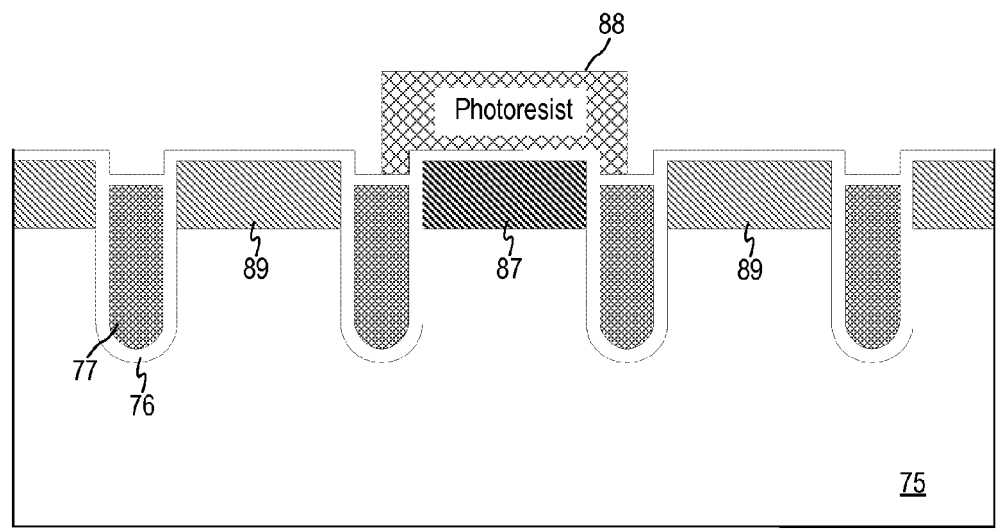
Figure 8D:
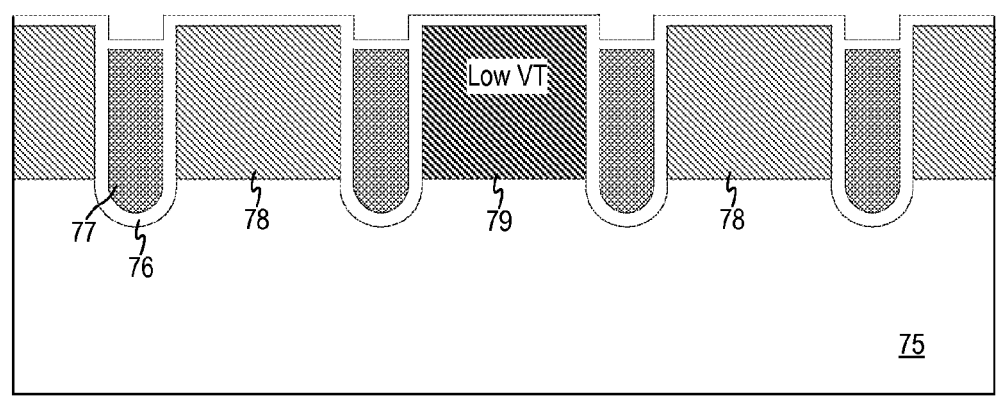

Referring to FIG. 8(b), a first blanket body implant 87 is performed to form the low threshold voltage body region for transistor M1. Referring to FIG. 8(c), the transistor cell for forming transistor M1 is masked by a photoresist layer 88 and a second blanket body implant 89 is performed to form the high threshold voltage body region for transistor M2. After thermal annealing, the body regions 78 and 79 are formed, as shown in FIG. 8(d).

Figure 8E:
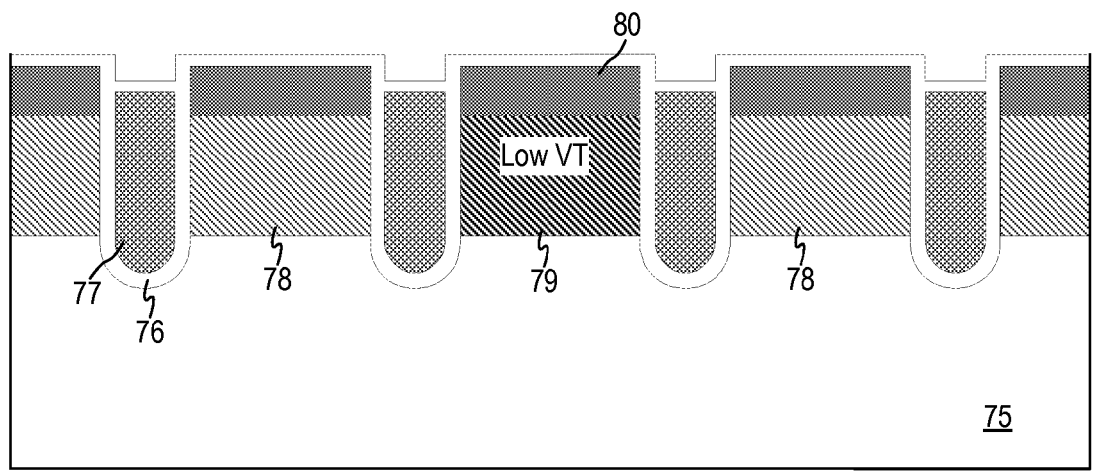
Figure 8F:
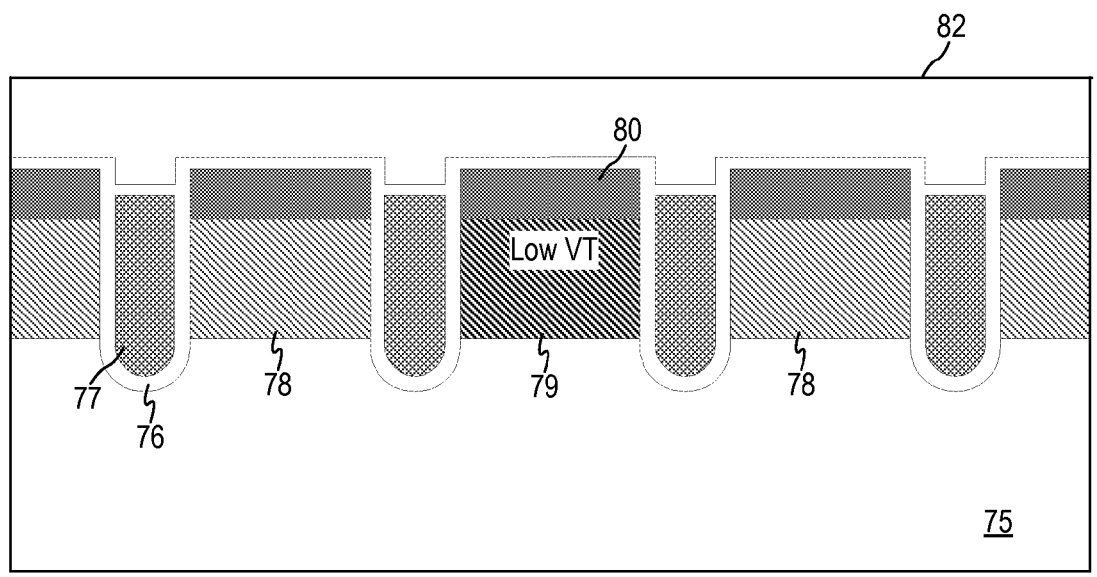
Figure 8G:
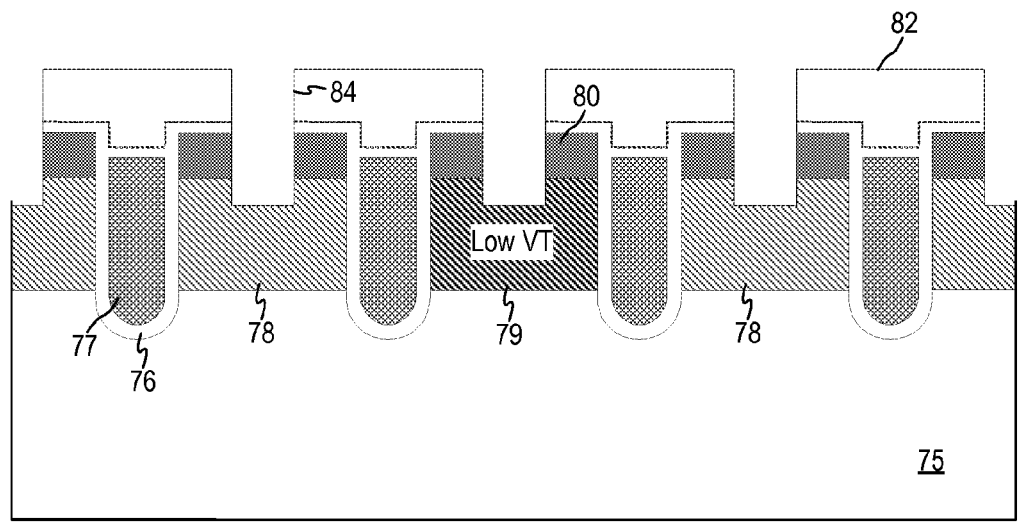
Figure 8H:
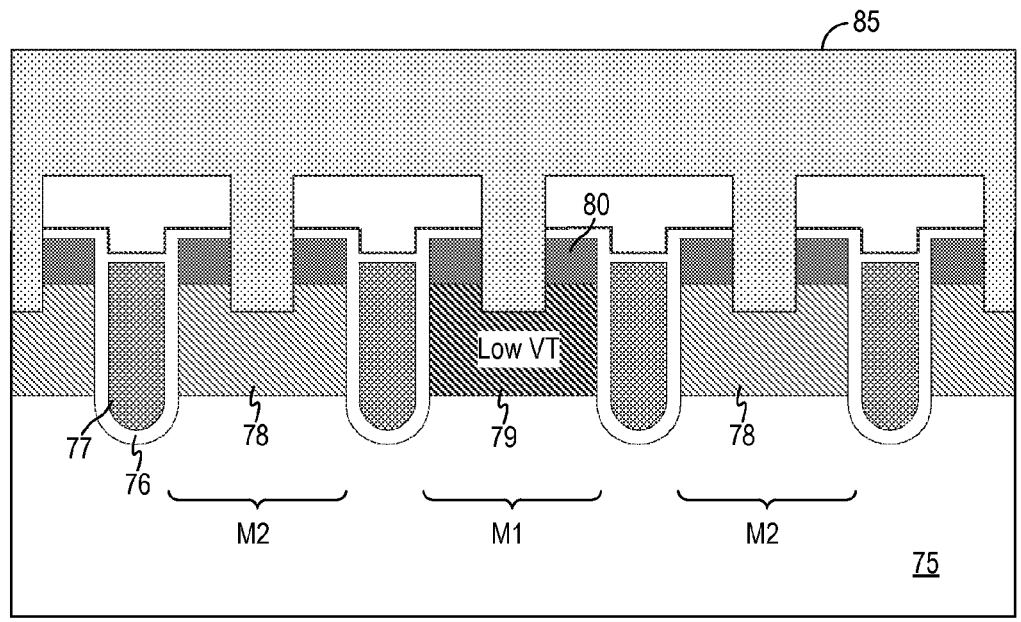

Referring to FIG. 8(e), source implant is performed to form source regions 80 in the top surface of the semiconductor layer 75. Subsequently, a planarized dielectric layer 82, such as a BPSG layer, is deposited on the front side of the semiconductor layer 75, as shown in FIG. 8(f). Contact openings 84 are formed in the dielectric layer 82 and through the source region into the body region, as shown in FIG. 8(g). A metal layer 85 is then deposited to fill the contact openings and to interconnect all the source regions to form the parallel-connected transistor pair.

The fabrication process described above is illustrative only and is not intended to be limiting. Other fabrication methods can be used to form the parallel-connected transistor pair described herein for use as a load switch circuit.

In the above described embodiments, the MOSFET devices or MOS transistors are described with reference to having source, drain and gate terminals. It is understood that the source and drain terminals of a MOS transistor are interchangeable and can be generally referred to as current handling terminals. The gate terminal of a MOS transistor is sometimes referred to as a control terminal.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A switch circuit having a first terminal, a second terminal and a control terminal, the switch circuit comprising:
   a first MOS transistor and a second MOS transistor of a same conductivity type connected in parallel between the first terminal and the second terminal, the first and second MOS transistors having respective gate terminals coupled to the control terminal to receive a control signal to turn the switch circuit on or off, the gate terminals of the first and second MOS transistors being electrically connected together and being connected to the control terminal and both being driven by the same control signal provided on the control terminal, the control signal transitioning from a first voltage level to a second voltage level at a slow rate of change, the first voltage level for turning off the first and second MOS transistors and the second voltage level for turning on the first and second MOS transistors; and
   a resistor coupled to the source terminal of the first MOS transistor to provide source ballasting,
   wherein the first MOS transistor has a first threshold voltage and the second MOS transistor has a second threshold voltage, the first threshold voltage being less than the second threshold voltage, and the first MOS transistor has a first transistor area and the second MOS transistor has a second transistor area, the first transistor area being smaller than the second transistor area; and
   wherein in response to the control signal being coupled to drive the gate terminals of both the first MOS transistor and the second MOS transistor, the first MOS transistor is turned on before the second MOS transistor in response to the control signal transitioning to the second voltage level and the second MOS transistor is turned off before the first MOS transistor in response to the control signal transitioning to the first voltage level; and
   wherein the first MOS transistor includes a reduced source diffusion region and a contact that overlies and in physical and electrical contact with the reduced source diffusion region, the contact including a metal layer formed in a contact opening that overlies at least the reduced source diffusion region, the reduced source diffusion region of the first MOS transistor having a reduced source diffusion region area as compared to the source region area of the second MOS transistor, the reduced source diffusion region having reduced area in physical and electrical contact with the contact, thereby increasing a source resistance for a source current flowing to the contact overlying the reduced source diffusion region, the increased source resistance forming the resistor providing source ballasting for the first MOS transistor.

2. The switch circuit of claim 1, wherein the first MOS transistor and the second MOS transistor comprise discrete transistors.

3. The switch circuit of claim 1, wherein the first MOS transistor and the second MOS transistor are formed on a semiconductor chip.

4. The switch circuit of claim 3, wherein the first MOS transistor comprises a first array of transistor cells and the second MOS transistor comprises a second array of transistor cells, the first array of transistor cells being evenly distributed among the second array of transistor cells.

5. The switch circuit of claim 1, wherein the first transistor area is between 5% to 45% of the second transistor area.

6. The switch circuit of claim 1, wherein the first MOS transistor has a first transconductance value and the second MOS transistor has a second transconductance value, the first transconductance value being less than the second transconductance value.

7. The switch circuit of claim 1, wherein each of the first MOS transistor and the second MOS transistor comprises a trench transistor having a gate terminal formed in a trench in a semiconductor layer.

8. The switch circuit of claim 7, wherein the first MOS transistor and the second MOS transistor are formed on a semiconductor chip, and the first MOS transistor comprises a first array of trench transistor cells and the second MOS transistor comprises a second array of trench transistor cells, the first array of transistor cells being evenly distributed among the second array of transistor cells.

9. The switch circuit of claim 8, wherein the first array of trench transistor cells comprises trench transistor cells having a first gate oxide thickness and the second array of trench transistor cells comprises trench transistor cells having a second gate oxide thickness, the first gate oxide thickness being thicker than the second gate oxide thickness.

10. The switch circuit of claim 8, wherein the first array of trench transistor cells comprises trench transistor cells having a first channel length and the second array of trench transistor cells comprises trench transistor cells having a second channel length, the first channel length being longer than the second channel length.

11. The switch circuit of claim 3, wherein the second MOS transistor comprises a trench transistor having a gate terminal formed in a trench in a semiconductor layer and the first MOS transistor comprises a transistor with a planar gate formed on a top surface of the semiconductor layer.

12. The switch circuit of claim 1, wherein the first and second MOS transistors comprise NMOS transistors and the control signal comprises a voltage signal transitioning from a low voltage level to a high voltage level at the slow rate of change for turning on the NMOS transistors and a voltage signal transitioning from a high voltage lever to a low voltage lever at the slow rate of change for turning off the NMOS transistors.

13. The switch circuit of claim 12, wherein the first and second MOS transistors are configured for low-side switching, where the first and second MOS transistors each has a first current handling terminal coupled to the first terminal which is coupled to a load, and a second current handling terminal coupled to the second terminal which is coupled to a negative voltage terminal of a supply voltage.

14. The switch circuit of claim 1, wherein the first and second MOS transistors comprise PMOS transistors and the control signal comprises a voltage signal transitioning from a high voltage level to a low voltage level at the slow rate of change for turning on the PMOS transistors and a voltage signal transitioning from a low voltage level to a high voltage level at the slow rate of change for turning off the PMOS transistors.

15. The switch circuit of claim 14, wherein the first and second MOS transistors are configured for high-side switching, where the first and second MOS transistors each has a first current handling terminal coupled to the first terminal which is coupled to a positive voltage terminal of a supply voltage, and a second current handling terminal coupled to the second terminal which is coupled to a load.

16. The switch circuit of claim 1, wherein the control signal has a rate of change of between 50 volts per second to 1000 volts per second.

17. The switch circuit of claim 7, wherein first MOS transistor comprises a reduced source diffusion region and a first body region and the second MOS transistor comprises a source region and a second body region formed in the semiconductor layer adjacent the trench, wherein doping levels of the first and second body regions are selected so that the first body region of the first MOS transistor has a threshold voltage lower than the threshold voltage of the second body region of the second MOS transistor.

18. The switch circuit of claim 17, wherein a resistor is formed in the reduced source diffusion region of the first MOS transistor to provide source ballasting.

* * * * *